United States Patent
Pal

(10) Patent No.: US 10,201,119 B2
(45) Date of Patent: Feb. 5, 2019

(54) SYSTEM AND METHOD OF ALTERNATE COOLING OF A LIQUID COOLED MOTOR CONTROLLER

(71) Applicant: Hamilton Sundstrand Corporation, Charlotte, NC (US)

(72) Inventor: Debabrata Pal, Hoffman Estates, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 14/728,037

(22) Filed: Jun. 2, 2015

(65) Prior Publication Data

US 2016/0360643 A1  Dec. 8, 2016

(51) Int. Cl.
| | | |
|---|---|---|
| H05K 7/20 | (2006.01) | |
| H05K 7/14 | (2006.01) | |
| H01H 9/52 | (2006.01) | |
| H01L 23/473 | (2006.01) | |

(52) U.S. Cl.
CPC ..... *H05K 7/20936* (2013.01); *H05K 7/20154* (2013.01); *H05K 7/20309* (2013.01); *H05K 7/20318* (2013.01); *H05K 7/20881* (2013.01); *H01H 9/52* (2013.01); *H01L 23/473* (2013.01); *H05K 7/1432* (2013.01); *H05K 7/20336* (2013.01)

(58) Field of Classification Search
CPC ........ H05K 7/2089–7/20918; H05K 7/20936; H05K 7/20845–7/20863; H05K 7/20881; H05K 7/2029; H05K 7/20336; H05K 7/20154; H05K 7/20309; H05K 7/20318; H05K 7/1432; H05K 2201/064; H05K 2201/066; H05K 2201/10416; H01L 23/473; H01H 9/52
USPC ................. 361/700, 702; 257/715, E23.088; 174/547–548, 15.2; 165/80.4–80.5, 165/104.33
See application file for complete search history.

(56) References Cited

U.S. PATENT DOCUMENTS

| | | | |
|---|---|---|---|
| 4,635,709 A | 1/1987 | Altoz | |
| 4,941,530 A | 7/1990 | Crowe | |
| 4,944,344 A | 7/1990 | Crowe | |
| 5,283,715 A | 2/1994 | Carlsten et al. | |
| 6,527,045 B1 * | 3/2003 | Osakabe | F28D 1/0333 165/104.33 |
| 8,300,412 B2 | 10/2012 | Pal | |
| 8,634,193 B2 * | 1/2014 | Zhou | H05K 7/20909 165/104.33 |
| 2006/0283573 A1 * | 12/2006 | Thors | F28F 3/048 165/80.4 |

(Continued)

OTHER PUBLICATIONS

European Search Report and Communication; Application No. 16172689.8-1803; dated Oct. 16, 2016; 8 pages.

*Primary Examiner* — Zachary Pape
(74) *Attorney, Agent, or Firm* — Cantor Colburn LLP

(57) ABSTRACT

A motor controller is provided including a motor controller housing an air inlet and an air outlet. A plurality of heat generating elements is disposed within the motor control housing. A cooling system includes a cooling device having a fluid sealed therein arranged within the motor control housing. The plurality of heat generating elements is cooled by conduction to the cooling device and by convection from an air flow between the air inlet and the air outlet.

13 Claims, 4 Drawing Sheets

(56) References Cited

U.S. PATENT DOCUMENTS

| | | | |
|---|---|---|---|
| 2008/0087456 A1* | 4/2008 | Schuette | H05K 1/0207 |
| | | | 174/252 |
| 2009/0180250 A1 | 7/2009 | Holling | |
| 2010/0157535 A1* | 6/2010 | Oniki | F28D 15/0233 |
| | | | 361/700 |
| 2013/0250516 A1 | 9/2013 | Pal | |
| 2014/0085820 A1* | 3/2014 | Yamamoto | H05K 7/20909 |
| | | | 361/695 |
| 2014/0321051 A1 | 10/2014 | Ng et al. | |

* cited by examiner

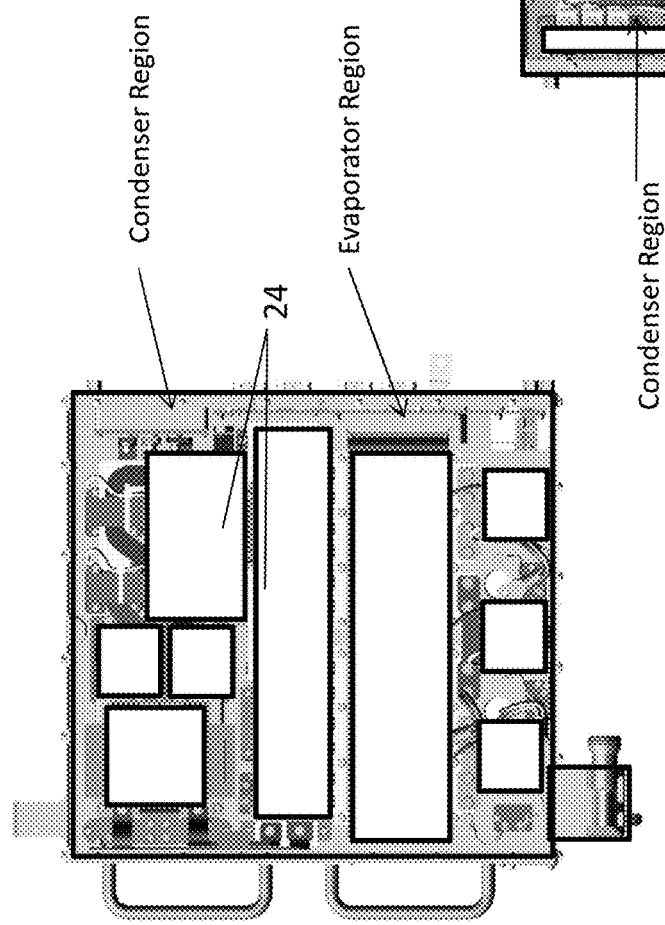
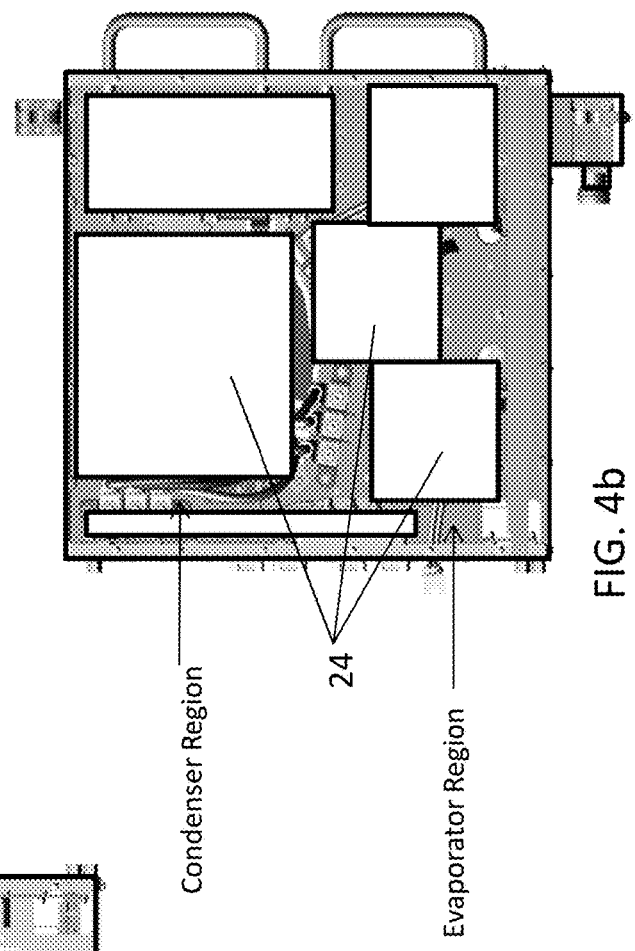
FIG. 4a
FIG. 4b

SYSTEM AND METHOD OF ALTERNATE COOLING OF A LIQUID COOLED MOTOR CONTROLLER

BACKGROUND

The subject matter disclosed herein relates to a motor controller and, more particularly, to a system for cooling a motor controller of an aircraft engine.

In modern aircraft engines, electrical power is generated by generators, which are driven by aircraft engines. Often, these generators are also used as electric starters to start engines. Motor controllers are used to control the starters and generator functions of these generators. Such motor controllers are often supportively disposed within the aircraft engine nacelle or other suitable locations such as electrical equipment bay (EE bay).

Generally, the motor controller includes various electrical components and sub-assemblies used for controlling generators, which generate electrical energy from the mechanical energy of the aircraft engine. The components and sub-assemblies include, for example, printed wiring boards, inductors and inverter modules, each of which generates varying amounts of heat that needs to be dissipated in order for the motor controller to operate properly. This is normally accomplished by flowing fuel or another suitable coolant, such as a Propylene Glycol water mixture, through a heat exchanger associated with the motor controller during ground operations. However, for some applications where a liquid cooled motor controller is used, only air and not liquid is available for cooling. The present disclosure provides a method where the existing liquid cooled motor controller can also be efficiently cooled by combination of two-phase cooling provided by the liquid cooled cold plate and air cooling.

BRIEF DESCRIPTION

According to one embodiment of the present disclosure, a motor controller is provided including a motor controller housing an air inlet and an air outlet. A plurality of heat generating elements is disposed within the motor control housing. A cooling system includes a cooling device having a fluid sealed therein arranged within the motor controller housing. The plurality of heat generating elements is cooled by conduction to the cooling device and by convection from an air flow between the air inlet and the air outlet.

According to another embodiment of the present disclosure, a method of cooling a motor controller includes providing a cooling device disposed within a motor control housing. The cooling device has a fluid sealed therein. An air flow is introduced into a first end of the motor control housing. The air flow is configured to cool a vaporized portion of the fluid such that the fluid condenses. The air flow is extracted from a second end of the motor control housing.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

FIGS. 4a and 4b are front and back views of the motor controller absent the motor control housing according to an embodiment of the present disclosure.

Figure 1:
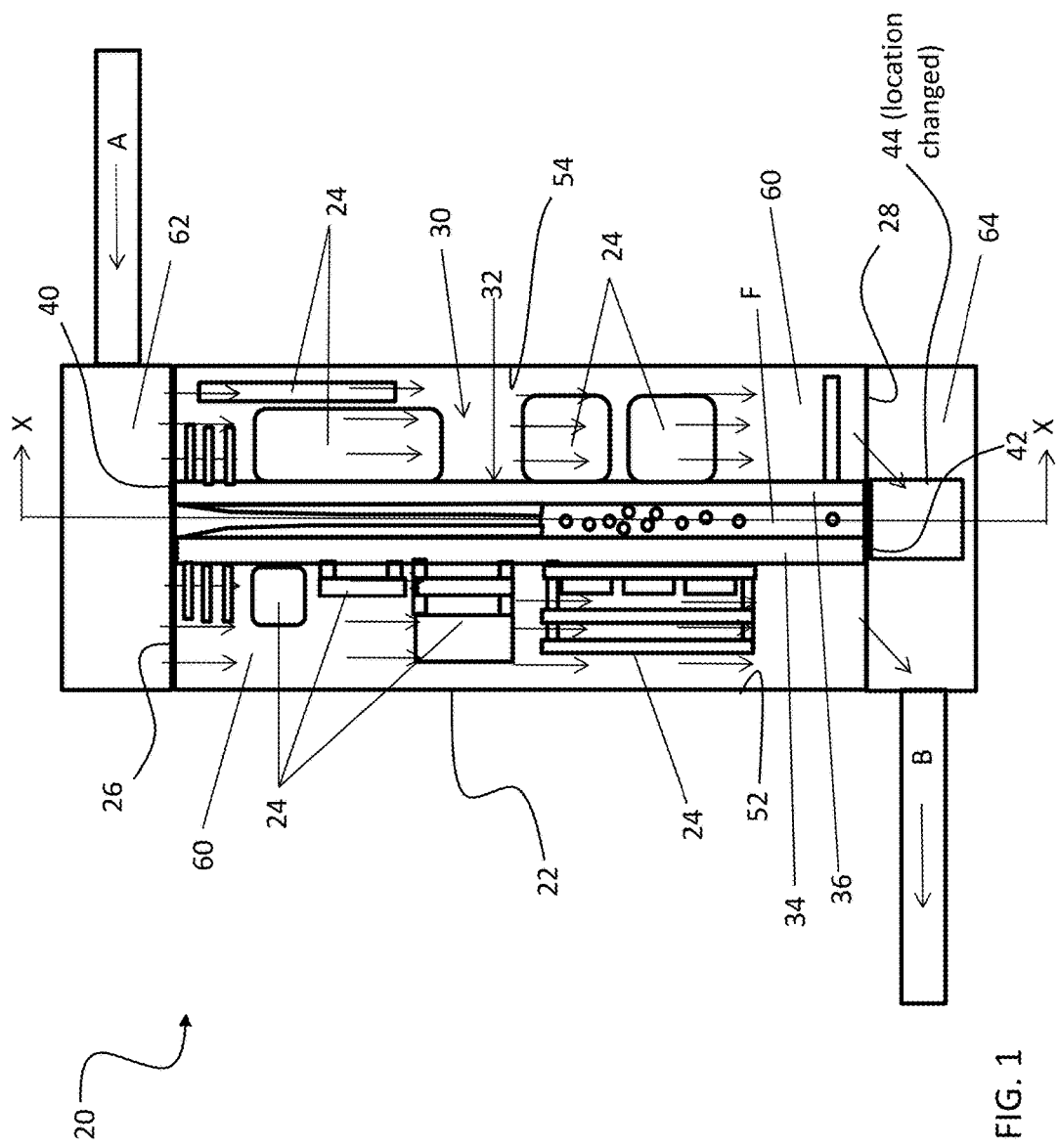
FIG. 1 is a cross-sectional view of a motor controller including a cooling system according to an embodiment of the present disclosure.

The detailed description explains embodiments of the invention, together with advantages and features, by way of example with reference to the drawings.

DETAILED DESCRIPTION OF THE INVENTION

Referring now to FIG. 1-4, an example of a motor controller 20 including an air cooling system 30 is illustrated. In one embodiment, the motor controller 20 is located adjacent a turbofan within the nacelle of an aircraft engine (not shown). The motor controller 20 includes a generally hollow motor control housing 22 within which one or more heat generating components 24 are mounted. Examples of the heat generating components 24 include, but are not limited to, a printed wire board (PWB), capacitor, inverter module, an insulated gate bipolar transistor (IGBT), bus bar, and inductor for example.

The air cooling system 30 of the motor controller 20 includes a cooling device 32 extending between a first end 26 and a second, opposite end 28 of the motor control housing 22. In one embodiment, the cooling device 32 is a cold plate. The cold plate 32 comprises a first and second substantially planar plate 34, 36 arranged generally parallel to one another and separated from each other by a distance. At least one fluid passage 38 (see FIG. 2) is defined within the gap formed between the first and second plates 34, 36 such that a fluid F may flow between the first and second ends 40, 42 of the cold plate 32. As shown in the FIGS. 1 and 2, a fluid inlet 44 is arranged in communication with the at least one fluid passage 38 for supplying a desired amount of fluid F to the interior of the cold plate 32. Once the desired amount of fluid is disposed therein, the fluid inlet 44 is sealed such that the total amount of fluid F within the cold plate 32 remains constant during operation of the motor controller 20. The fluid F sealed within the cold plate 32 may have a lowered boiling temperature compared to the fluid used in a conventional cold plate, such as 72° C. for example. However, other fluids commonly used in sealed systems are within the scope of the disclosure.

Due to the heat transfer that occurs within the motor controller housing 22, the fluid sealed within the cold plate 32 is configured to cycle between a liquid and a vapor to remove heat from the motor controller 20. However, it should be understood that a cooling system 30 of the motor controller 20 using another cooling device 32, such as a heat pipe for example, is also within the scope of the disclosure.

Figure 2:
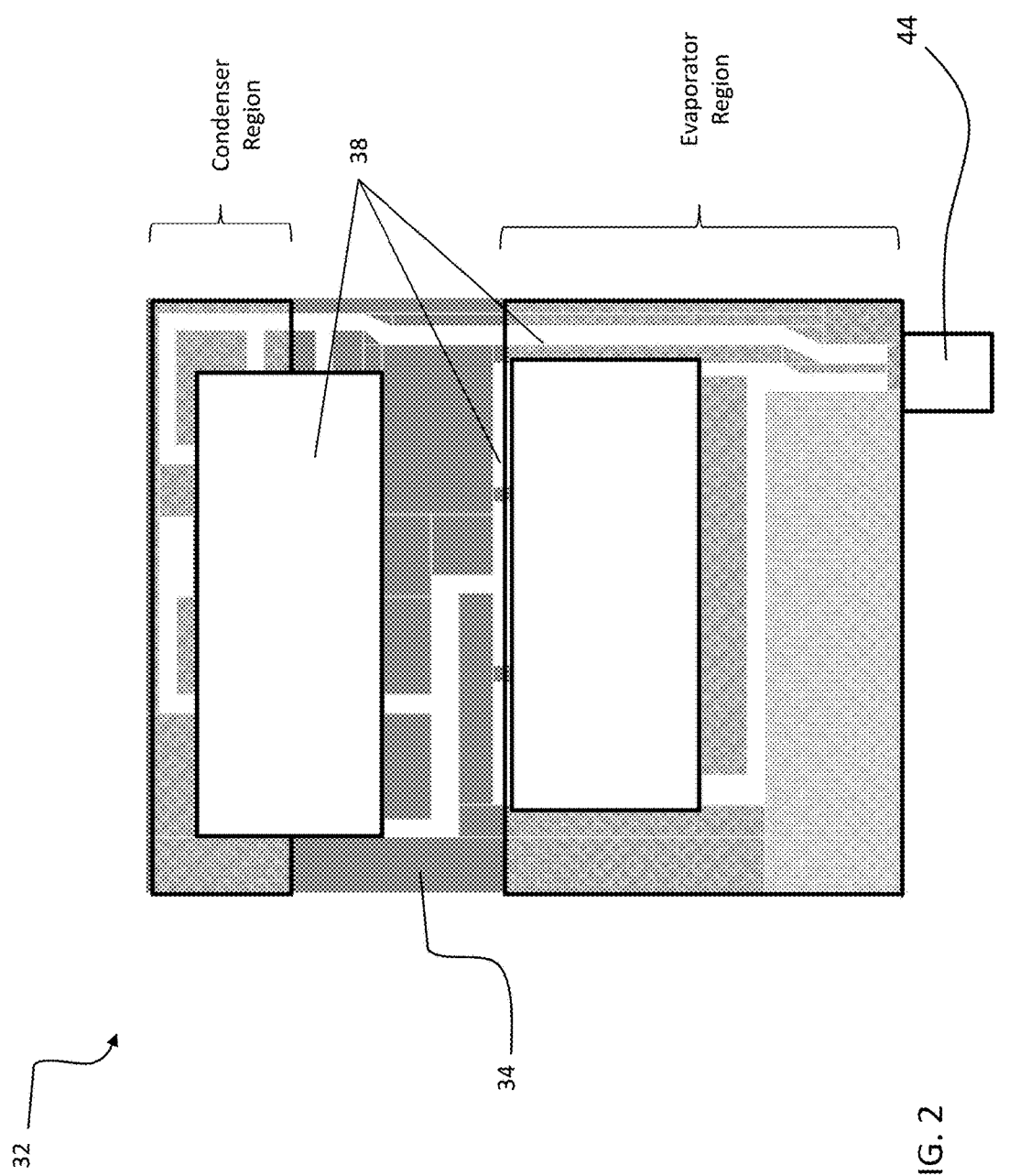
FIG. 2 is a cross-sectional view of a portion of the motor controller taken along X-X of FIG. 1, according to an embodiment of the present disclosure.

With reference now to FIG. 2, a portion of the cold plate 32, such as adjacent the second end 42 of the cold plate 32 for example, is defined as an evaporator region. In the evaporator section, heat is transferred to a liquid portion of the fluid disposed therein, causing the liquid to vaporize. Similarly, another portion of the cold plate 32, for example adjacent the first end 40 of the cold plate 32, may be defined as a condenser region. In the condenser region, heat is released from the vaporized portion of the fluid, causing the vapor to condense to a liquid. In the condenser area, fins may be attached to the cold plate surfaces 34 and 36, disposed between the cold plate surfaces and the housing, to enhance heat transfer for a condenser (see FIG. 1).

Figure 3:
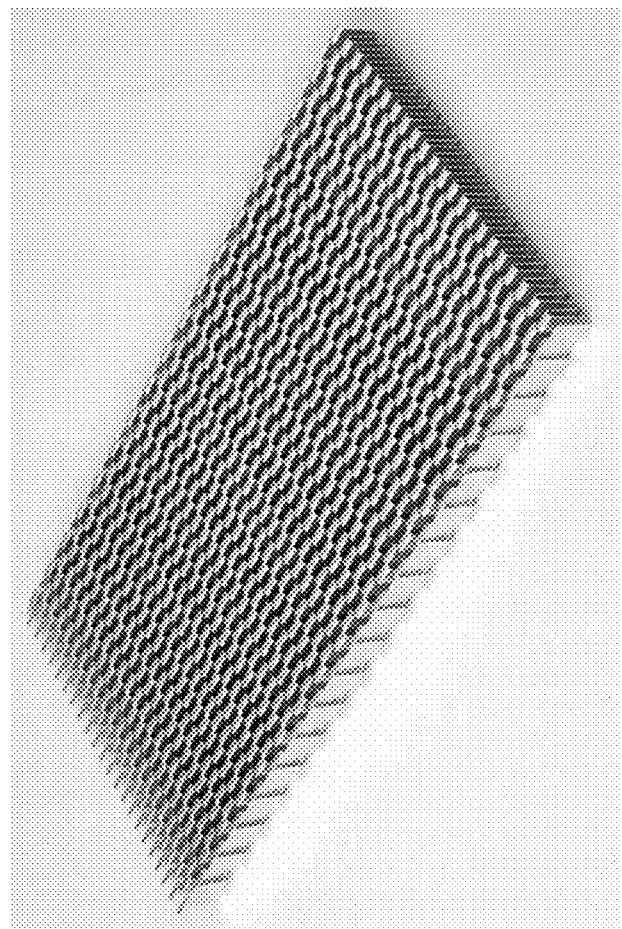
FIG. 3 is a perspective view of a fin core of a cold plate according to an embodiment of the present disclosure.

Referring now to FIG. 3, a plurality of fins may form a fin core 50 configured to enhance the heat transferability of the cold plate 32. More specifically, the fin core 50 may be interposed between at least a portion of the first and second plate 34, 36. In one embodiment, the portion of the fin core 50 arranged within the evaporator region of the cold plate 32 has a high fin density. A high fin density may be defined as a fin/distance ratio between about 18-25 fins/inch or greater.

As shown in FIGS. 4a and 4b, the heat generating components 24 of the motor controller 20 are mounted at various positions to one or both of the first plate 34 and the second plate 36 of the cold plate 32. To optimize the efficiency of the cooling system 30, the components 24 configured to produce the greatest amount of heat are arranged within the evaporator region of the cold plate 32, near the second end 42 thereof, to maximize the amount of heat transferred to the liquid portion of the fluid F within the cold plate 32. As should be understood by a person having ordinary skill in the art, the positioning of the components 24 and the configuration of the cold plate 32 will vary based on a given application and the amount of heat to be dissipated.

Referring again to FIG. 1, one or more openings (not shown) are formed in both the first end 26 and the second end 28 of the motor control housing 22 to define an air flow channel 60 between each of the first and second plates 34, 36 and an adjacent sidewall 52, 54 of the housing 22, respectively. During operation of the motor controller 20, cool inlet air A such as provided by a fan for example, is fed via an inlet duct or plenum 62 through the one or more openings (not shown) formed in the first end 26 of the housing 22. This air flow convectively cools the plurality of heat generating components 24 within the motor housing 22. Warmer air, as indicated by arrow B in FIG. 1, is similarly output from the motor control housing 22, such as to an outlet plenum or duct 64 coupled thereto, via the plurality of openings (not shown) formed in the second end 28 of the housing 22.

The heat generated by the plurality of components 24 mounted to the cold plate 32 also conducts through the first and second plates 34, 36, respectively, to the fluid F trapped within the interior of the cold plate 32. In the configuration of the illustrated, non-limiting embodiment, a portion of the fluid F in a liquid phase is arranged near the second end 42 of the cold plate 32. As heat from the plates 34, 36 conducts to the fluid, the liquid within the evaporator region vaporizes and travels through the one or more fluid passages 38 to the condensing region, near the first end 52 of the cold plate 32. In addition to convectively cooling the heat generating components 24, a portion of the cool air A provided at the first end 26 of the motor housing 22 is configured to conductively cool the vaporized fluid within the condenser region via the first and second plates 34, 36. The heat transfer that occurs between the vaporized fluid and the cool air A causes the vaporized fluid to cool and condense into a liquid which then moves through the fluid passage 38, such as due to gravity for example, back to the second end 42 of the cold plate 32.

An air cooled motor controller 20 as described herein enables the use of a liquid-cooled motor controller in additional applications where a power electronics cooling system is not available on an aircraft. Only thermal modifications need be completed to adapt the motor controller from a liquid cooled application to an air cooled application. In addition, the air cooled motor controller 20 disclosed herein results in an improved heat transfer such that other components previously configured to enhance the heat transfer of the system, for example an inductor housing, may be eliminated resulting in both a weight and cost reduction.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A motor controller, comprising
 a motor control housing having an air inlet and an air outlet;
 a plurality of heat generating elements disposed within the motor control housing; and
 a cooling system including a cooling device arranged within the motor control housing and extending from a first housing end of the motor control housing to a second housing end of the motor control housing opposite the first housing end, the cooling device and the motor control housing thus defining two airflow channels therebetween, the cooling device having a fluid sealed therein and including:
 a first planar plate;
 a second planar plate separated from the first planar plate by a distance, thereby defining a fluid passage between the first planar plate and the second planar plate wherein the fluid is sealed;
 an evaporating region wherein the fluid absorbs heat via vaporization; and
 a condensing region wherein the vaporized fluid releases heat via condensation;
 wherein the plurality of heat generating elements is cooled by conduction to the cooling device and by convection from an airflow between the air inlet and the air outlet; and
 wherein the airflow cools the vaporized fluid at the condensing region;
 wherein at least one heat generating element of the plurality of heat generating elements is mounted at each of the first planar plate and the second planar plate; and
 wherein at least one heat generating element of the plurality of heat generating elements is disposed in each of the evaporating region and the condensing region.

2. The motor controller according to claim 1, wherein at least a portion of the plurality of heat generating elements are mounted to the cooling device.

3. The motor controller according to claim 1, wherein a first portion of the cooling device is configured as the evaporating region such that the fluid disposed therein absorbs heat via vaporization.

4. The motor controller according to claim 3, wherein the first portion of the cooling device includes a high density fin core disposed between the first planar plate and the second planar plate.

5. The motor controller according to claim 4, wherein the high density fin core comprises at least 18 fins per inch.

6. The motor controller according to claim 3, wherein a second portion of the cooling device is configured as the condensing region such that the fluid disposed therein releases heat via condensation.

7. The motor controller according to claim 6, wherein the condensing region of the cooling device is disposed vertically above the evaporating region of the cooling device.

8. The motor controller according to claim 1, wherein the cooling device is a cold plate.

9. The motor controller according to claim 1, wherein the cooling device is a heat pipe.

10. The motor controller according to claim 1, wherein the fluid sealed within the cooling device is configured to cycle between a liquid and a vapor.

11. A method of cooling a motor controller, comprising:
providing a cooling device disposed within a motor control housing and extending from a first housing end of the motor control housing to a second housing end of the motor control housing opposite the first housing end, the cooling device and the motor control housing thus defining two airflow channels therebetween, the cooling device having a fluid sealed therein and including:
a first planar plate;
a second planar plate separated from the first planar plate by a distance, thereby defining a fluid passage between the first planar plate and the second planar plate wherein the fluid is sealed;
an evaporating region wherein the fluid absorbs heat via vaporization; and
a condensing region wherein the vaporized fluid releases heat via condensation;
wherein at least one heat generating element of a plurality of heat generating elements is mounted at each of the first planar plate and the second planar plate; and
wherein at least one heat generating element of the plurality of heat generating elements is disposed in each of the evaporating region and the condensing region;
introducing an air flow into a first end of the motor control housing, the air flow travelling along the two airflow channels, cooling a vaporized portion of the fluid at the condensing region such that the fluid condenses; and
extracting the air flow from a second end of the motor control housing.

12. The method according to claim 11, wherein upon cooling of the vaporized portion of the fluid, the fluid is configured to travel to an opposite end of the cooling device.

13. The method according to claim 12, wherein a fan is configured to move the air flow through the motor control housing.

* * * * *